United States Patent
Wang et al.

(10) Patent No.: US 10,025,488 B2
(45) Date of Patent: Jul. 17, 2018

(54) MULTIPOINT LOCATING METHOD AND DEVICE ON TOUCH SCREEN WITH SINGLE CONDUCTING LAYER

(71) Applicant: FocalTech Systems, Ltd., Grand Cayman (KY)

(72) Inventors: Lidongzi Wang, Shenzhen (CN); Wenlei Zhang, Shenzhen (CN); Hua Li, Shenzhen (CN)

(73) Assignee: FocalTech Systems, Ltd., George Town, Grand Cayman (KY)

( * ) Notice: Subject to any disclaimer, the term of this patent is extended or adjusted under 35 U.S.C. 154(b) by 1132 days.

(21) Appl. No.: 13/713,148

(22) Filed: Dec. 13, 2012

(65) Prior Publication Data

US 2014/0052398 A1 Feb. 20, 2014

(30) Foreign Application Priority Data

Aug. 15, 2012 (CN) .......................... 2012 1 0291434

(51) Int. Cl.
*G06F 3/044* (2006.01)
*G06F 3/048* (2013.01)
*G01R 27/26* (2006.01)
*G06F 3/0488* (2013.01)

(52) U.S. Cl.
CPC ............ *G06F 3/0488* (2013.01); *G06F 3/044* (2013.01); *G01R 27/2605* (2013.01); *G06F 2203/04104* (2013.01)

(58) Field of Classification Search
CPC ............................... G06F 3/044; G06F 3/0488
USPC ......................................................... 702/65
See application file for complete search history.

(56) References Cited

U.S. PATENT DOCUMENTS

| 8,154,529 | B2 | 4/2012 | Sleeman et al. |
| 8,736,568 | B2 | 5/2014 | Sleeman et al. |
| 8,941,597 | B2 * | 1/2015 | Chang et al. .................. 345/173 |
| 2006/0097991 | A1 * | 5/2006 | Hotelling .............. G06F 3/0416 345/173 |
| 2010/0258360 | A1 * | 10/2010 | Yilmaz ................... G06F 3/044 178/18.06 |
| 2010/0289754 | A1 | 11/2010 | Sleeman et al. |
| 2010/0309167 | A1 * | 12/2010 | Nam ....................... G06F 3/044 345/174 |

(Continued)

FOREIGN PATENT DOCUMENTS

| CN | 101840295 A | 9/2010 |
| CN | 101887323 A | 11/2010 |

(Continued)

OTHER PUBLICATIONS

First Office Action for Chinese Paten Application 201210291434.2 in Mandarin with a partial English translation provided by Unitalen Attorneys at Law dated Dec. 2, 1014.

*Primary Examiner* — Michael Dalbo
(74) *Attorney, Agent, or Firm* — Harness, Dickey & Pierce, P.L.C.

(57) ABSTRACT

Multipoint locating method and device on a touch screen with a single conducting layer are provided. In the method, if there is a minimum detection unit with a capacitance variation amount greater than a preset condition to be partitioned, partitioning out a calculation matrix corresponding to the minimum detection unit to be partitioned. Therefore, multipoint locating on a touch screen with a single conducting layer is implemented.

6 Claims, 6 Drawing Sheets

(56) References Cited

U.S. PATENT DOCUMENTS

| | | | |
|---|---|---|---|
| 2011/0069029 A1 | 3/2011 | Ryu et al. | |
| 2012/0194452 A1* | 8/2012 | Cho | G06F 3/0416 345/173 |
| 2012/0235937 A1 | 9/2012 | Sleeman et al. | |
| 2012/0256872 A1* | 10/2012 | Kawaguchi | G06F 3/044 345/174 |
| 2012/0262419 A1* | 10/2012 | Hershman | G06F 3/044 345/174 |
| 2012/0306802 A1* | 12/2012 | McCracken | G06F 3/0416 345/174 |
| 2013/0002579 A1* | 1/2013 | Hatano | 345/173 |
| 2013/0342497 A1 | 12/2013 | Mo | |

FOREIGN PATENT DOCUMENTS

| | | |
|---|---|---|
| CN | 102681738 A | 9/2012 |
| CN | 102799325 A | 11/2012 |
| TW | 201133315 A | 10/2011 |

\* cited by examiner

MULTIPOINT LOCATING METHOD AND DEVICE ON TOUCH SCREEN WITH SINGLE CONDUCTING LAYER

CROSS-REFERENCE TO RELATED APPLICATIONS

The present application claims priority to Chinese Patent Application No. 201210291434.2, filed on Aug. 15, 2012 and entitled "MULTIPOINT LOCATING METHOD AND DEVICE ON TOUCH SCREEN WITH SINGLE CONDUCTING LAYER", the entire disclosure of which is incorporated herein by reference.

FIELD OF THE INVENTION

The present invention relates to the technical field of locating a touch screen, and in particular to a multipoint locating method and device on a touch screen with a single conducting layer.

BACKGROUND OF THE INVENTION

A capacitive screen is a kind of screen that is rapidly emerged after the application of resistive screen, and is widely used in a mobile telephone and a Mobile Internet Device (MID). Application of the existing capacitive screen mainly includes an application of single-point touch plus gesture touch and an application of multipoint touch.

For the application of single-point touch plus gesture touch, the capacitive screen thereof is a unit of detection unit formed by one pair of triangle substrates (as shown in FIG. 1a), and a position touched by a person is determined by detecting a capacitance variation of the unit of detection unit. In structure, the capacitive screen is provided with a single conducting layer as an induction unit, and the formation of the induction unit with the single conducting layer is simple for a production process.

However, the existing capacitive screen with a single conducting layer has a technical disadvantage of failing to implement multipoint touch or locate, due to a simple structure of a single-point touch plus gesture touch screen.

SUMMARY OF THE INVENTION

Therefore, the present invention provides a multipoint locating method on a touch screen with a single conducting layer, to achieve an exact multipoint locating on a touch screen with a single conducting layer.

In the multipoint locating method on a touch screen with a single conducting layer, the conducting layer of the touch screen is provided with at least two columns of electrode groups, the electrode group includes several minimum detection units, the minimum detection unit includes at least one pair of electrodes in a complementary arrangement. The method includes:

receiving a touch signal and triggering generation of an original matrix in unit of the minimum detection unit according to the touch signal;

calculating a capacitance variation amount of each of the minimum detection units in a touch signal induction area separately and extracting one of the minimum detection units with a capacitance variation amount reaching a minimum calculation threshold and being a capacitance variation amount maximum;

if there is a minimum detection unit to be partitioned with a capacitance variation amount greater than a preset condition, partitioning out a calculation matrix corresponding to the minimum detection unit to be partitioned; and calculating a position of the minimum detection unit with the capacitance variation amount maximum in the original matrix, and searching the calculation matrix for a minimum detection unit with a capacitance variation amount reaching the minimum calculation threshold and being the capacitance variation amount maximum and calculating a position of the minimum detection unit in the calculation matrix.

Preferably, the method further includes:

obtaining position relationship information of a minimum detection unit with a first capacitance variation amount maximum and a minimum detection unit with a second capacitance variation amount maximum, and a sum of the capacitance variation amounts of the two minimum detection units, which is represented as a first capacitance variation amount;

collecting a sum of capacitance variation amounts of minimum detection units in a same position relationship with the two minimum detection units separately, which is represented as a second capacitance variation amount;

if a difference between the first capacitance variation amount and the second capacitance variation amount is greater than a preset difference, preserving the minimum detection unit with a larger capacitance variation amount out of the minimum detection unit with the first capacitance variation amount maximum and the minimum detection unit with the second capacitance variation amount maximum, and calculating a position of the minimum detection unit in the original matrix.

Preferably, the partitioning out the calculation matrix corresponding to the minimum detection unit to be partitioned includes:

in a case that there is one minimum detection unit to be partitioned, extracting an induction area with a capacitance variation amount corresponding to the minimum detection unit to be partitioned, and equipartitioning the induction area into two areas having a same number of minimum detection units, wherein a matrix each area locates is used as the calculation matrix.

Preferably, the partitioning out the calculation matrix corresponding to the minimum detection unit to be partitioned includes:

in a case that there is one minimum detection unit to be partitioned, extracting an induction area with a capacitance variation amount corresponding to the minimum detection unit to be partitioned, and equipartitioning the induction area into two areas having equal sums of the capacitance variation amounts, wherein a matrix each area locates is used as the calculation matrix.

Preferably, the method further includes:

in a case that there are two minimum detection units to be partitioned, extracting position information of the two minimum detection units to be partitioned respectively, wherein the position information includes row and column positions of the two minimum detection units to be partitioned;

if the two minimum detection units to be partitioned are in a same row of the electrodes, partitioning out a middle matrix by a column of minimum detection units between the two minimum detection units to be partitioned;

or if the two minimum detection units to be partitioned are in different rows of the electrodes, partitioning out a middle matrix by a row of minimum detection units between the two minimum detection units to be partitioned.

Preferably, the calculating the position of the minimum detection unit with the capacitance variation amount maximum in the original matrix, searching the calculation matrix for the minimum detection unit with the capacitance variation amount reaching the minimum calculation threshold and being the capacitance variation amount maximum, and calculating the position of the minimum detection unit in the calculation matrix corresponding to the minimum detection unit includes:

calculating a parameter $X_C$ of a x-axis in the corresponding matrix, including:

$$X_C = \frac{\text{peak}}{\text{peak} + \text{couple}}$$

wherein

"peak" is a sum of capacitance variation amounts of all minimum detection units in a column direction in an induction area the minimum detection unit locates;

"couple" is a sum of capacitance variation amounts of all minimum detection units in columns adjacent to the column with a largest sum of capacitance variation amounts in a column direction in a column induction area the minimum detection locates;

and calculating a parameter $Y_C$ of a y-axis in the corresponding matrix, including:

$$Y_C = \frac{Y(a-1)*(a-1) + Ya*a + Y(a+1)*(a+1)}{Y(a-1) + Y(a) + Y(a+1)},$$

Y=peak+couple;
wherein

"a" is a position of a column the minimum detection unit locates in all minimum detection units in the induction area;

the method further includes:

projecting the parameter $X_C$ of the x-axis and the parameter $Y_C$ of the y-axis into a corresponding coordinates system to work out a real coordinates of the minimum detection unit.

Corresponding to the above method, a multipoint locating device on a touch screen with a single conducting layer is provided, and the device includes:

an original matrix generation unit for receiving a touch signal and triggering generation of an original matrix in unit of a minimum detection unit according to the touch signal;

a capacitance variation amount calculation unit for calculating a capacitance variation amount of electrodes in a touch signal induction area and exacting a minimum detection unit with a capacitance variation amount reaching a minimum calculation threshold and being a capacitance variation amount maximum;

a matrix partition unit for, if there is a minimum detection unit to be partitioned with a capacitance variation amount greater than a preset condition in minimum detection units with the capacitance variation amount maximum, partitioning out a calculation matrix corresponding to the minimum detection unit to be partitioned; and a coordinates calculation unit for calculating a position of the minimum detection unit with the capacitance variation amount maximum in the original matrix, searching the calculation matrix for a minimum detection unit with a capacitance variation amount reaching the minimum calculation threshold and being the capacitance variation amount maximum, and calculating a position of the minimum detection unit in the calculation matrix corresponding to the minimum detection unit.

It can be seen from the above technical solution that in the embodiments of the present invention, based on the structure of the touch screen with a single conducting layer, constructing an original matrix in unit of the minimum detection unit, extracting a minimum detection unit with a capacitance variation amount maximum in an induction area with capacitance variation, partitioning the minimum detection unit corresponding to a single touch signal generated by two or several touch signals, searching the calculation matrix for a minimum detection unit with a capacitance variation amount reaching a minimum calculation threshold and being the capacitance variation amount maximum, and calculating the position of the minimum detection unit in the calculation matrix. Therefore, the position calculation can be performed without interference of other touch signals, and the accuracy of the position calculation of the partitioned minimum detection unit with the capacitance variation amount maximum in the touch screen is improved. By calculating the position of the unpartitioned minimum detection unit and the minimum detection unit in the calculation matrix, therefore, technical defect in the prior art that several touch signals cannot be distinguished when a multipoint distinguishing is needed in a case of a single conducting layer is overcame, and multipoint locating on the touch screen with the single conducting layer is achieved.

BRIEF DESCRIPTION OF THE DRAWINGS

In order to explain technical solutions of embodiments of the present invention or the prior art more clearly, a brief introduction of drawings to be used in the embodiments of the present invention or the prior art will be made below. Apparently, the drawings described below are merely some embodiments of the present invention, and other drawings can be obtained according to these drawings by those skilled in the art without creative labor.

DETAILED DESCRIPTION OF THE INVENTION

A clear and full description of technical solutions of embodiments of the present invention is made below in conjunction with drawings of the embodiments of the present invention. Apparently, the described embodiments are merely parts of embodiments and not all of embodiments of the present invention. Based on the embodiments of the present invention, all other embodiments obtained by those skilled in the art without creative labor are all belong to the protection scope of the present invention.

An embodiment of the present invention discloses a multipoint locating method on a touch screen with a single conducting layer, to achieve an exact multipoint locating on a touch screen with a single conducting layer.

Figure 1A:
FIG. 1a is a schematic structure diagram of an existing touch screen with a single conducting layer with a unit of detection unit formed by triangle substrates in the present disclosure.
Figure 1B:
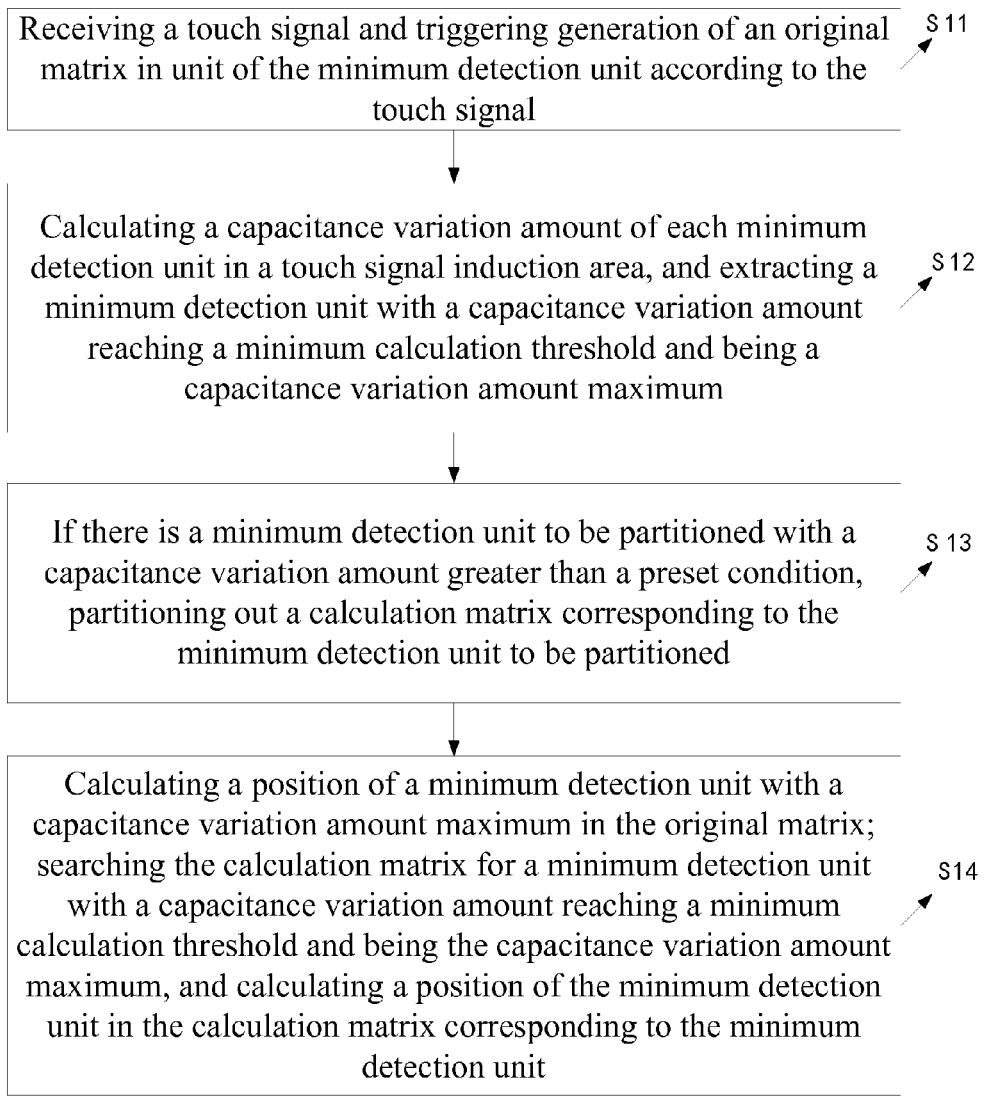
FIG. 1b is a flow chart of a multipoint locating method on a touch screen with a single conducting layer according to an embodiment of the present invention.

FIG. 1b illustrates a multipoint locating method for a touch screen with a single conducting layer.

The conducting layer of the touch screen is provided with at least two columns of electrode groups, the electrode group includes several minimum detection units, and the minimum detection unit includes at least one pair of electrodes in a complementary arrangement.

In an embodiment of the present invention, taking three columns of electrode groups as a base of example, and in the embodiment, the minimum detection units form a row in a lateral direction so as to facilitate marking and partition of a matrix. The method includes the following steps.

S11: receiving a touch signal and triggering generation of an original matrix in unit of the minimum detection unit according to the touch signal.

Figure 1C:
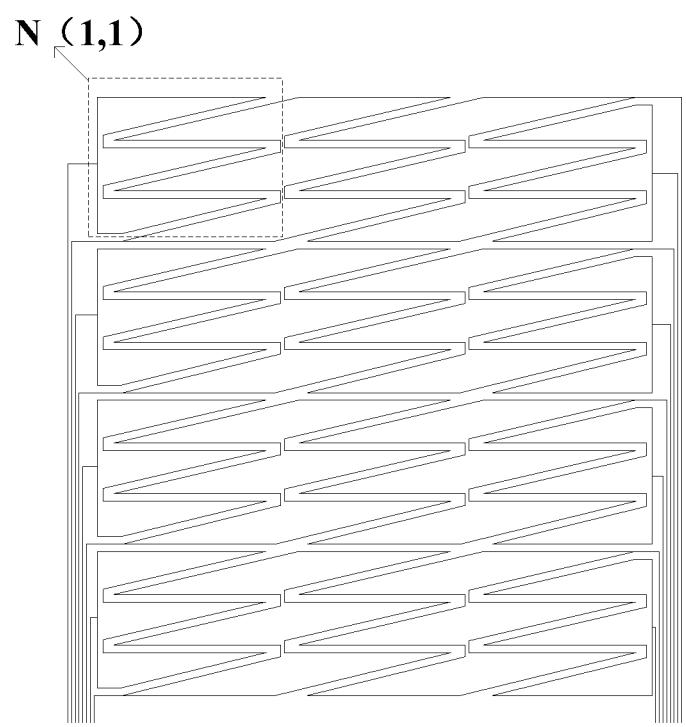
FIG. 1c is a schematic structure diagram on a touch screen with a single conducting layer according to an embodiment of the present invention.

Under the above hypothesis, taking minimum detection units of four rows and three columns as an example, the original matrix is N(1,1), N(2,1), N(3,1), N(4,1) . . . N(4,3), as shown in FIG. 1c.

S12: calculating a capacitance variation amount of each of the minimum detection units in a touch signal induction area, and extracting one of a minimum detection unit with a capacitance variation amount reaching a minimum calculation threshold and being a capacitance variation amount maximum.

The touch signal will bring capacitance variation of each minimum detection unit in the induction area, and the area of the induction area due to the touch signal will be different as the touch is different, that is, the number of the minimum detection units in the area is different, and the sum of the capacitance variation amounts of the minimum detection units is different.

It is deemed that there is no real touch for a touch signal with a capacitance variation amount not reaching the minimum calculation threshold.

S13: if there is a minimum detection unit to be partitioned with a capacitance variation amount greater than a preset condition, partitioning out a calculation matrix corresponding to the minimum detection unit to be partitioned.

Failure to implement multipoint touch locating in a touch screen with a single conduction layer result from that touch signals placed on the touch screen at the same time cannot be differentiated in a single conduction layer. The accuracy of locating in a case that several touch signals are combined into one touch signal. For example, the capacitance variation amount exceeds a normal range, the numerical capacitance variation amount of each detection unit around the minimum detection unit to be partitioned exceeds a certain proportion of the minimum detection unit to be partitioned (for example, 25%), or the number of the minimum detection units with capacitance variation due to the touch signal is too large.

Aiming at the problem in the prior art that multipoint touch locating cannot be performed, in the present embodiment, for a touch signal which is a stack of two touch signals, the induction area with capacitance variation thereof and the total sum of capacitance variation amounts of minimum detection units are lager than the induction area of single touch signal and the total sum of the capacitance variation amounts of minimum detection units of a single touch signal, therefore the minimum detection unit caused by such touch signal is partitioned into different calculation matrixes.

Therefore, partitioning the calculation matrix includes:
for a minimum detection unit to be partitioned,
extracting an induction area with the capacitance variation amount corresponding to the minimum detection unit to be partitioned;
equipartitioning the induction area into two areas having a same number of minimum detection units, and a matrix each area locates is used as the calculation matrix;
or
extracting an induction area with the capacitance variation amount corresponding to the minimum detection unit to be partitioned;
equipartitioning the induction area into two areas having equal sums of the capacitance variation amounts, and a matrix each area locates is used as the calculation matrix, for example, the minimum detection unit to be partitioned is N(2,2), with an expression $$b = \frac{N(2, 2) + N(2, 3) - N(2, 1)}{2},$$

b is a partitioned part for N(2,1), others is a partitioned part for N(2,3). Therefore, the two partitioned parts are [N(2,1) b 0] and [0 N(2,2)–b N(2,3)].

The above partition is based on a case that the two signals composing the touch signal to be partitioned have substantially same induction areas or substantially same sums of capacitance variation amounts, but the partition is not limited to such manner.

S14: calculating a position of a minimum detection unit with a capacitance variation amount maximum in the original matrix; searching the calculation matrix for a minimum detection unit with a capacitance variation amount reaching a minimum calculation threshold and being the capacitance variation amount maximum, and calculating a position of the minimum detection unit in the calculation matrix corresponding to the minimum detection unit.

Calculating the parameter $X_C$ of the x-axis in the corresponding matrix, which includes:

$$X_C = \frac{\text{peak}}{\text{peak} + \text{couple}};$$

wherein,
"peak" is a sum of capacitance variation amounts of all minimum detection units in a column direction in an induction area the minimum detection unit locates;
"couple" is a sum of capacitance variation amounts of all minimum detection units in columns adjacent to the column with a largest sum of capacitance variation amounts in a column direction in a column induction area the minimum detection locates;
the parameter $X_C$ is a relative position ratio of an unpartitioned minimum detection unit with a capacitance variation amount maximum in the original matrix and a position ratio of a partitioned minimum detection unit with a capacitance variation amount maximum in a corresponding calculation matrix. As the parameter $X_C$ is calculated in the calculation matrix, interference of other touch signals is excluded and accuracy of position calculation of the partitioned minimum detection unit with a capacitance variation amount maximum in the touch screen is improved.

Calculating the parameter $Y_C$ of the y-axis in the corresponding matrix which includes:

$$Y_C = \frac{Y(a-1)*(a-1)+Ya*a+Y(a+1)*(a+1)}{Y(a-1)+Y(a)+Y(a+1)},$$

Y=peak+couple;
wherein
"a" is a position of a column the minimum detection unit locates in all minimum detection units in the induction area.

That is, if the current touch screen has a structure of 10 rows and 3 columns, then a has a range of 1-10.

The expression of the parameter $Y_C$ of the y-axis uses weighted average arithmetic (i.e., center of gravity arithmetic), but it is not limited to this implement.

S15: projecting the parameter $X_C$ of the x-axis and the parameter $Y_C$ of the y-axis into a corresponding coordinates system to work out a real coordinates of the minimum detection unit.

In the calculation matrix, working out the position of the partitioned minimum detection unit, which is, along with the unpartitioned minimum detection unit with the capacitance variation amount maximum consequently, projected into the coordinates system of the capacitive screen, to determine the coordinates of the touch signal.

Figure 2:
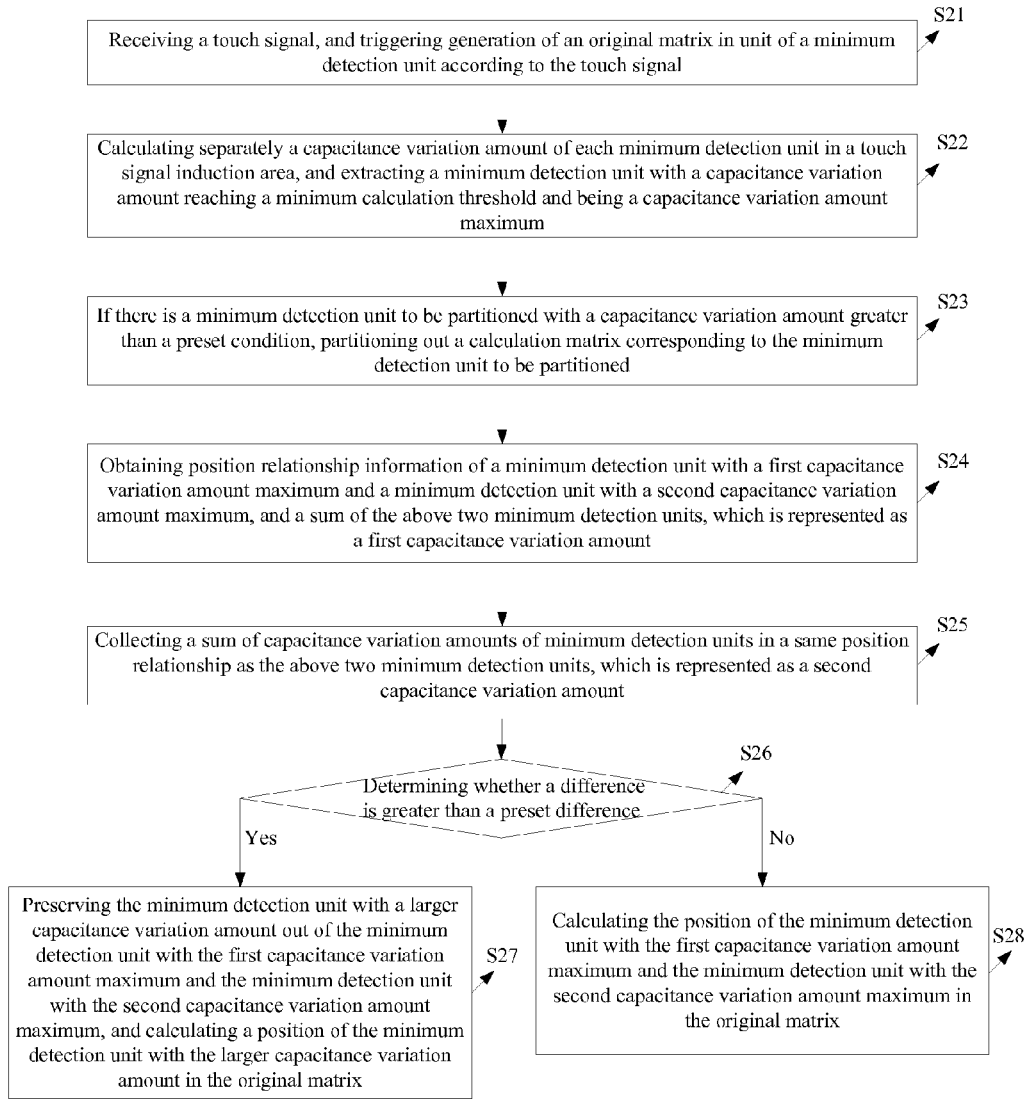
FIG. 2 is a flow chart of a multipoint locating method on a touch screen with a single conducting layer according to another embodiment of the present invention.

FIG. 2 illustrates another multipoint locating method for a touch screen with a single conducting layer, which includes the following steps.

S21: receiving a touch signal, and triggering generation of an original matrix in unit of a minimum detection unit according to the touch signal.

S22: calculating separately a capacitance variation amount of each of minimum detection units in a touch signal induction area, and extracting one of the minimum detection units with a capacitance variation amount reaching a minimum calculation threshold and being a capacitance variation amount maximum.

S23: if there is a minimum detection unit to be partitioned with a capacitance variation amount greater than a preset condition, partitioning out a calculation matrix corresponding to the minimum detection unit to be partitioned.

S24: obtaining position relationship information of a minimum detection unit with a first capacitance variation amount maximum and a minimum detection unit with a second capacitance variation amount maximum, and a sum of the above two minimum detection units, which is represented as a first capacitance variation amount.

S25: collecting a sum of capacitance variation amounts of minimum detection units in a same position relationship as the above two minimum detection units, which is represented as a second capacitance variation amount.

S26: determining whether a difference between the first capacitance variation amount and the second capacitance variation amount is greater than a preset difference, performing S27 if the difference is greater than the preset difference and performing S28 otherwise.

S27: preserving the minimum detection unit with a larger capacitance variation amount out of the minimum detection unit with the first capacitance variation amount maximum and the minimum detection unit with the second capacitance variation amount maximum, and calculating a position of the minimum detection unit with the larger capacitance variation amount in the original matrix.

If the two minimum detection units are adjacent in a diagonal position, then it needs evaluating whether an incorporation of these two minimum detection units should be made. The principle of incorporation is: N(2,2) and N(3,1) is obviously greater than N(1,1) and N(4,2), which shows that the two minimum detection units are prone to be caused by one same touch signal. After the two minimum detection units are incorporated, the minimum detection unit with a larger capacitance variation amount is preserved and the other minimum detection unit is disregarded.

S28: calculating the position of the minimum detection unit with the first capacitance variation amount maximum and the minimum detection unit with the second capacitance variation amount maximum in the original matrix.

In the present embodiment, performing incorporation in a case when mistaking one touch signal as two touch signals, and thus the calculation amount is decreased and the calculation time is saved.

Figure 3:
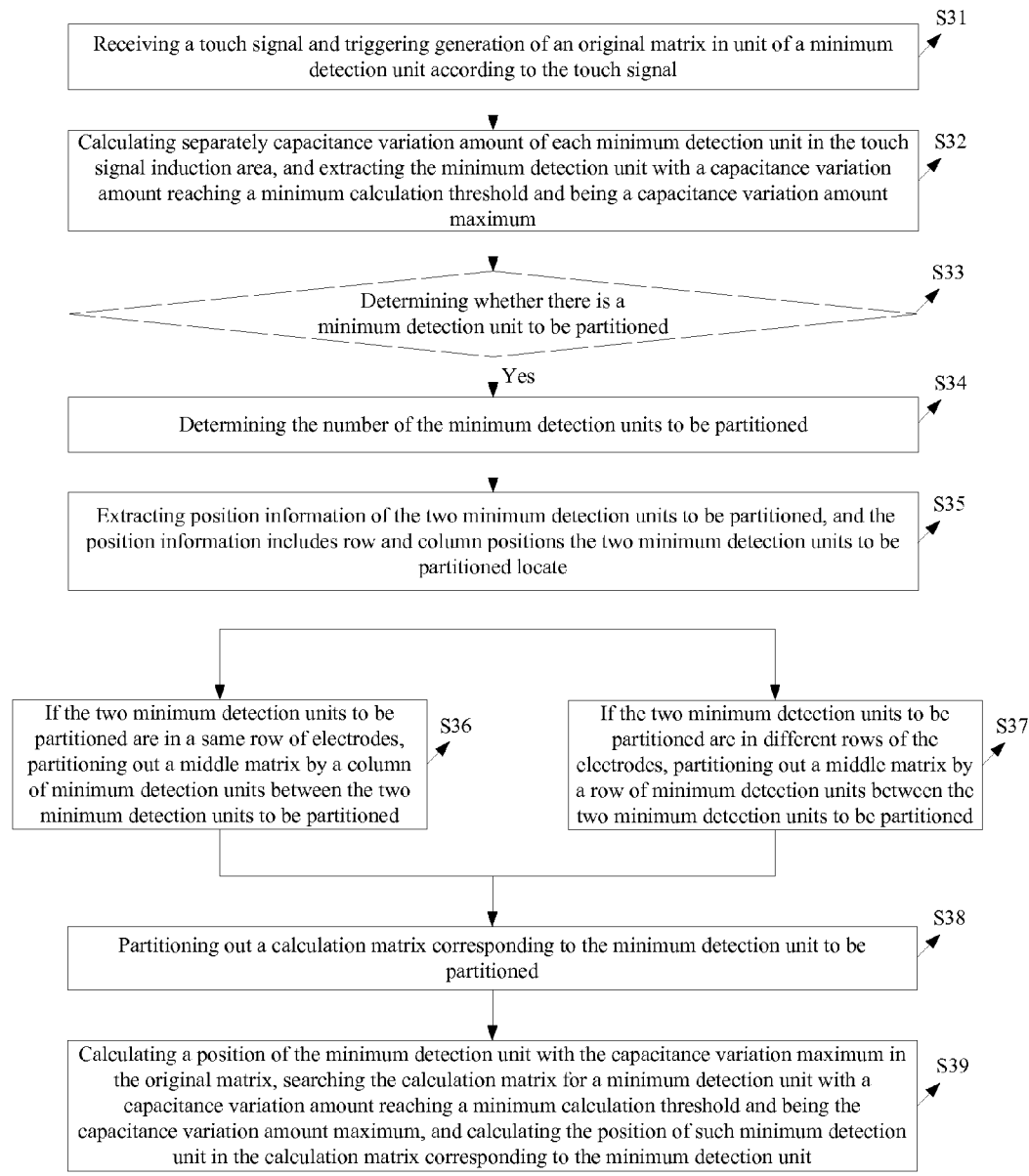
FIG. 3 is a flow chart of a multipoint locating method on a touch screen with a single conducting layer according to another embodiment of the present invention.

FIG. 3 illustrates another multipoint locating method for a touch screen with a single conducting layer, which includes the following steps.

S31: receiving a touch signal and triggering generation of an original matrix in unit of a minimum detection unit according to the touch signal.

S32: calculating separately capacitance variation amount of each of the minimum detection units in the touch signal induction area, and extracting one of the minimum detection units with a capacitance variation amount reaching a minimum calculation threshold and being a capacitance variation amount maximum.

S33: determining whether there is a minimum detection unit to be partitioned with a capacitance variation amount greater than a preset condition, and performing S34 if there is.

S34: determining the number of the minimum detection units to be partitioned, and performing S35 if there are two minimum detection units to be partitioned.

S35: extracting position information of the two minimum detection units to be partitioned, and the position information includes row and column positions the two minimum detection units to be partitioned locate.

S36: if the two minimum detection units to be partitioned are in a same row of electrodes, partitioning out a middle matrix by a column of minimum detection units between the two minimum detection units to be partitioned.

As an example, when the two minimum detection units to be partitioned locate in the first and third columns respectively, numerical value in the second column needs to be partitioned: partitioning the original three columns [1 2 3] into two matrixes of [1 x0] and [0 2−x3].

S37: if the two minimum detection units to be partitioned are in different rows of the electrodes, partitioning out a middle matrix by a row of minimum detection units between the two minimum detection units to be partitioned.

Taking N(2,1) and N(3,2) as an example, N(2,2) and N(3,1) need to be partitioned respectively, and form two matrixes with N(2,1) and N(3,2) respectively.

The partition of the middle matrix separates the matrix each minimum detection unit to be partitioned locates from other sub-matrixes, so as to facilitate an exact calculation of the partitioned minimum detection unit in the calculation matrix.

S38: partitioning out a calculation matrix corresponding to the minimum detection unit to be partitioned.

S39: calculating a position of the minimum detection unit with the capacitance variation maximum in the original matrix, searching the calculation matrix for a minimum detection unit with a capacitance variation amount reaching a minimum calculation threshold and being the capacitance variation amount maximum, and calculating the position of such minimum detection unit in the calculation matrix corresponding to the minimum detection unit.

Figure 4:
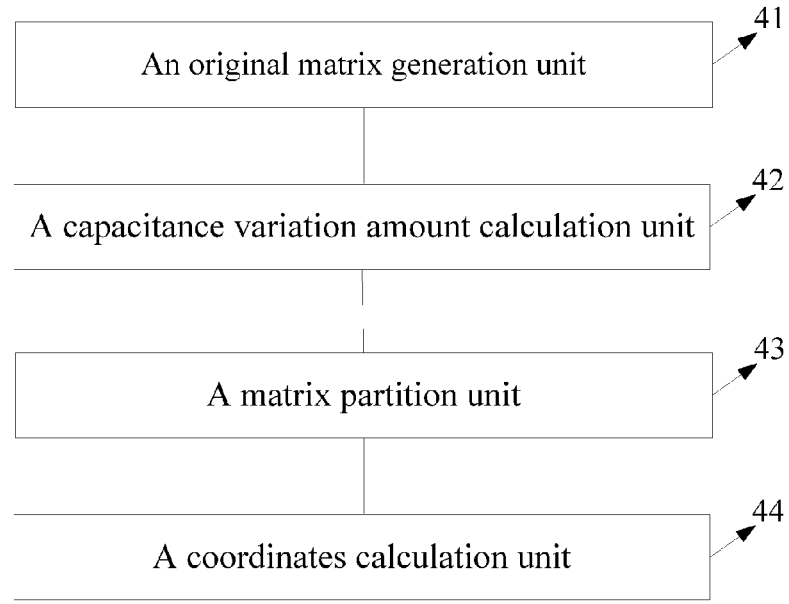
FIG. 4 is a schematic structure diagram of a multipoint locating device on a touch screen with a single conducting layer according to an embodiment of the present invention.

FIG. 4 illustrates a multipoint locating device for a touch screen with a single conducting layer, which includes:

an original matrix generation unit 41 for receiving a touch signal and triggering generation of an original matrix in unit of a minimum detection unit according to the touch signal;

a capacitance variation amount calculation unit 42 for calculating capacitance variation amount of electrodes in a touch signal induction area, and extracting a minimum detection unit with a capacitance variation amount reaching a minimum calculation threshold and being a capacitance variation amount maximum;

a matrix partition unit 43 for if there is a minimum detection unit to be partitioned with a capacitance variation amount greater than a preset condition in minimum detection units with the capacitance variation amount maximum, partitioning out a calculation matrix corresponding to the minimum detection unit to be partitioned;

a coordinates calculation unit 44 for calculating a position of the minimum detection unit with the capacitance variation amount maximum in the original matrix, searching the calculation matrix for a minimum detection unit with a capacitance variation amount reaching the minimum calculation threshold and being the capacitance variation amount maximum, and calculating a position of the minimum detection unit in the calculation matrix corresponding to the minimum detection unit.

Figure 5:
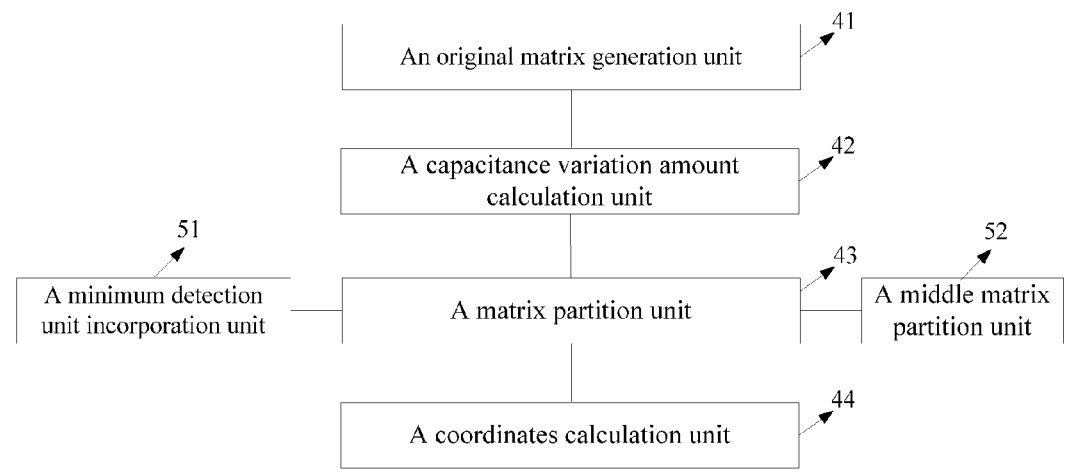
FIG. 5 is a schematic structure diagram of a multipoint locating device on a touch screen with a single conducting layer according to another embodiment of the present invention.

FIG. 5 illustrates another multipoint locating device for a touch screen with a single conducting layer, which includes the units illustrated and described in FIG. 4, and further includes:

a minimum detection unit incorporation unit 51 for, if both a difference between a minimum detection unit with a first capacitance variation amount maximum and a capacitance variation amount corresponding to the minimum detection unit in the touch signal induction area and a difference between a minimum detection unit with a second capacitance variation amount maximum and the capacitance variation amount corresponding to the minimum detection unit in the touch signal induction area are greater than a preset difference, preserving the minimum detection unit with a larger capacitance variation amount out of the minimum detection unit with the first capacitance variation amount maximum and the minimum detection unit with the second capacitance variation amount maximum, and calculating a position of the minimum detection unit in the original matrix;

a middle matrix partition unit 52 for, in a case that there are two minimum detection units to be partitioned, extracting position information of the two minimum detection units to be partitioned respectively, the position information including row and column positions of the two minimum detection units to be partitioned;

if the two minimum detection units to be partitioned are in a same row of the electrodes, partitioning out a middle matrix by a column of minimum detection units between the two minimum detection units to be partitioned;

or if the two minimum detection units to be partitioned are in different rows of the electrodes, partitioning out a middle matrix by a row of minimum detection units between the two minimum detection units to be partitioned.

Since the device embodiment substantially corresponds to the method embodiment, so the description thereof is brief, and corresponding parts thereof can be referred to the method embodiment. The above described device embodiment is merely illustrative, and units described as separate parts may be or may not be separate physically, and part used as a display unit may be or may not be a physical unit, that is, may be located on a central processor or distributed on several network units. Purpose of schemes of the present embodiments may be achieved by selecting part or all of the modules thereof according to a practice requirement.

To sum up, in the embodiments of the present invention, based on a structure of a touch screen with a single conducting layer, constructing an original matrix in unit of the minimum detection unit, extracting a minimum detection unit with a capacitance variation amount maximum in an induction area with capacitance variation, partitioning the minimum detection unit corresponding to a single touch signal generated by two or several touch signals, searching the calculation matrix for a minimum detection unit with a capacitance variation amount reaching a minimum calculation threshold and being the capacitance variation amount maximum, and calculating the position of the minimum detection unit in the calculation matrix. Therefore, the position calculation can be performed without interference of other touch signals, and the accuracy of the position calculation of the partitioned minimum detection unit with the capacitance variation amount maximum in the touch screen is improved. By calculating the position of the unpartitioned minimum detection unit and the minimum detection unit in the calculation matrix, therefore, technical defect in the prior art that several touch signals cannot be distinguished when a multipoint distinguishing is needed in a case of a single conducting layer is overcame, and multipoint locating on the touch screen with the single conducting layer is achieved.

Embodiments of the present disclosure are described in a step-up manner, and each embodiment gives emphasis to the difference with other embodiments, so same or similar parts among the embodiments may be referred to each other. For the disclosed device embodiments, since it corresponds to method embodiments, so the description thereof is brief and relevant parts thereof can be referred to the description of method embodiments.

Those skilled in the art can be understand that the illustrated units and arithmetic steps described in conjunction with embodiments of the present disclosure can be implemented as an electronic hardware, a computer software or a combination thereof. In order to explain the interchangeableness of hardware and software, illustrated components and steps are generally described according to functions in the description. Whether the function is performed in hardware or in software is depending on a specific application of the technical solution and a design restriction. Those skilled in the art may use different methods to implement the described function according to each specific application, and this implement should not be interpreted as going beyond the scope of the present invention.

It can be understood by those skilled in the art that all or part of the flow in the above method embodiments can be implemented by a relevant hardware instructed by a computer program, the program may be stored in a computer readable access medium which may include the flow of the above method embodiments when the program is performed. Wherein, the storage medium may be a disk, a disc, a Read-Only Memory (ROM) or a Random Access Memory (RAM), etc.

Those skilled in the art can implement or use the present invention according to the above description of the disclosed embodiments. Various amendments to those embodiments are obvious for those skilled in the art. A general principle defined herein may be implemented in other embodiments without departing from the spirit or scope of the present invention. Therefore, the present invention is not limited to those illustrated embodiments in the disclosure, and is accorded with a broadest scope consistent with the principle of the present disclosure and the novelty feature.

The invention claimed is:

1. A multipoint locating method on a touch screen with a single conducting layer, wherein the touch screen is a self-capacitance touch screen and wherein the single conducting layer of the touch screen is provided with at least two columns of electrode groups, the electrode group comprises several minimum detection units, the minimum detection unit comprises at least one pair of electrodes in a complementary arrangement, the method comprising:
   receiving a touch signal and triggering generation of an original matrix in unit of the minimum detection unit according to the touch signal;
   calculating a capacitance variation amount of each of the minimum detection units in a touch signal induction area separately and extracting one of the minimum detection units with a capacitance variation amount reaching a minimum calculation threshold and being a capacitance variation amount maximum;
   if there is a minimum detection unit to be partitioned with a capacitance variation amount greater than a preset condition, partitioning out a calculation matrix corresponding to the minimum detection unit to be partitioned;
   calculating a position of the minimum detection unit with the capacitance variation amount maximum in the original matrix by searching the calculation matrix for a minimum detection unit with a capacitance variation amount reaching the minimum calculation threshold and being the capacitance variation amount maximum and calculating a position of the minimum detection unit in the calculation matrix;
   projecting the calculated position of the minimum detection unit in the calculation matrix into a coordinate system of the touch screen to work out a real coordinate of the minimum detection unit; and
   determining the real coordinate of the minimum detection unit as a location of a touch,
   wherein the partitioning out the calculation matrix corresponding to the minimum detection unit to be partitioned comprising:
   in a case that there is one minimum detection unit to be partitioned,
   extracting an induction area which comprises minimum detection units whose capacitance variation amount is not zero and corresponds to the minimum detection unit to be partitioned,
   wherein the partitioning of the minimum detection unit N(p, q) yields two parts [N(p, q−1) b 0] and [0 N(p, q)−b N(p, q+1)], wherein b is the partition part of N(p, q), and p and q are coordinates of the minimum detection unit.

2. The multipoint locating method on the touch screen with the single conducting layer according to claim 1, further comprising:
   obtaining position relationship information of a first minimum detection unit with a first capacitance variation amount maximum and a second minimum detection unit with a second capacitance variation amount maximum, and a sum of the capacitance variation amounts of the first and second minimum detection units, which is represented as a first capacitance variation amount;
   collecting a sum of capacitance variation amounts of minimum detection units in a same position relationship with the first and second minimum detection units separately, which is represented as a second capacitance variation amount; and
   if a difference between the first capacitance variation amount and the second capacitance variation amount is greater than a preset difference, preserving the minimum detection unit with a larger capacitance variation amount out of the minimum detection unit with the first capacitance variation amount maximum and the minimum detection unit with the second capacitance variation amount maximum, and calculating a position of the minimum detection unit in the original matrix.

3. The multipoint locating method on the touch screen with the single conducting layer according to claim 1, further comprising:
   in a case that there are two minimum detection units to be partitioned, extracting position information of the two minimum detection units to be partitioned respectively, wherein the position information comprises row and column positions of the two minimum detection units to be partitioned; and
   if the two minimum detection units to be partitioned are in a same row of the electrodes, partitioning out a middle matrix by a column of minimum detection units between the two minimum detection units to be partitioned;
   or
   if the two minimum detection units to be partitioned are in different rows of the electrodes, partitioning out a middle matrix by a row of minimum detection units between the two minimum detection units to be partitioned.

4. A multipoint locating device on a touch screen with a single conducting layer, wherein the touch screen is a self-capacitance touch screen, and wherein the single conducting layer of the touch screen is provided with at least two columns of electrode groups, the electrode group comprises several minimum detection units, the minimum detection unit comprises at least one pair of electrodes in a complementary arrangement, the device comprising:
   an original matrix generation unit for receiving a touch signal and triggering generation of an original matrix in unit of the minimum detection unit according to the touch signal;
   a capacitance variation amount calculation unit for calculating a capacitance variation amount of each of the minimum detection units in a touch signal induction area separately and exacting one of the minimum detection units with a capacitance variation amount reaching a minimum calculation threshold and being a capacitance variation amount maximum;
   a matrix partition unit for, if there is a minimum detection unit to be partitioned with a capacitance variation amount greater than a preset condition in minimum detection units with the capacitance variation amount maximum, partitioning out a calculation matrix corresponding to the minimum detection unit to be partitioned; and a coordinates calculation unit for calculating a position of the minimum detection unit with the capacitance variation amount maximum in the original matrix by searching the calculation matrix for a minimum detection unit with a capacitance variation amount reaching the minimum calculation threshold and being the capacitance variation amount maximum, and calculating a position of the minimum detection unit in the calculation matrix corresponding to the minimum detection unit, project the calculated position of the minimum detection unit in the calculation matrix into a coordinate system of the touch screen to work out a real coordinate of the minimum detection unit, and determine the real coordinate of the minimum detection unit as a location of a touch, wherein the matrix partition unit is configured to:

in a case that there is one minimum detection unit to be partitioned, extract an induction area capacitance variation amount that is not zero and corresponds to the minimum detection unit to be partitioned, wherein the partitioning of the minimum detection unit $N(p, q)$ yields two parts $[N(p, q-1)\ b\ 0]$ and $[0\ N(p, q)-b\ N(p, q+1)]$, wherein b is the partition part of $N(p, q)$, and p and q are coordinates of the minimum detection unit.

5. The multipoint locating device on the touch screen with the single conducting layer according to claim 4, further comprising:

a minimum detection unit incorporation unit for, if both a difference between a minimum detection unit with a first capacitance variation amount maximum and a capacitance variation amount corresponding to the minimum detection unit in the touch signal induction area and a difference between a minimum detection unit with a second capacitance variation amount maximum and the capacitance variation amount corresponding to the minimum detection unit in the touch signal induction area are greater than a preset difference, preserving the minimum detection unit with a larger capacitance variation amount out of the minimum detection unit with the first capacitance variation amount maximum and the minimum detection unit with the second capacitance variation amount maximum, and calculating a position of the minimum detection unit in the original matrix.

6. The multipoint locating device on the touch screen with the single conducting layer according to claim 4, further comprising:

a middle matrix partition unit for, in a case that there are two minimum detection units to be partitioned, extracting position information of the two minimum detection units to be partitioned respectively, wherein the position information comprises row and column positions of the two minimum detection units to be partitioned; and if the two minimum detection units to be partitioned are in a same row of the electrodes, partitioning out a middle matrix by a column of minimum detection units between the two minimum detection units to be partitioned;

or if the two minimum detection units to be partitioned are in different rows of the electrodes, partitioning out a middle matrix by a row of minimum detection units between the two minimum detection units to be partitioned.

* * * * *